US010446468B2

United States Patent
Lowe et al.

(10) Patent No.: US 10,446,468 B2
(45) Date of Patent: Oct. 15, 2019

(54) METHOD OF FABRICATING COMPOUND SEMICONDUCTOR DEVICE STRUCTURES HAVING POLYCRSTALLINE CVD DIAMOND

(71) Applicant: RFHIC Corporation, Anyang (KR)

(72) Inventors: Frank Yantis Lowe, Phoenix, AZ (US); Daniel Francis, Oakland, CA (US); Firooz Nasser-Faili, Log Gatos, CA (US); Daniel James Twitchen, High Wycombe (GB)

(73) Assignee: RFHIC CORPORATION, Anyang (KR)

( * ) Notice: Subject to any disclaimer, the term of this patent is extended or adjusted under 35 U.S.C. 154(b) by 0 days.

(21) Appl. No.: 16/283,787

(22) Filed: Feb. 24, 2019

(65) Prior Publication Data
US 2019/0189533 A1    Jun. 20, 2019

Related U.S. Application Data

(62) Division of application No. 15/531,463, filed as application No. PCT/EP2015/079061 on Dec. 9, 2015, now Pat. No. 10,297,526.
(Continued)

(30) Foreign Application Priority Data

Feb. 18, 2015   (GB) .................................. 1502698.2

(51) Int. Cl.
*H01L 23/373*    (2006.01)
*H01L 21/02*    (2006.01)
(Continued)

(52) U.S. Cl.
CPC ...... *H01L 23/3732* (2013.01); *H01L 21/0237* (2013.01); *H01L 21/0254* (2013.01);
(Continued)

(58) Field of Classification Search
CPC ............. H01L 51/56; H01L 2251/5338; H01L 51/0072; H01L 51/5016; H01L 51/0097
(Continued)

(56) References Cited

U.S. PATENT DOCUMENTS 7,095,157 B2 * 8/2006  Sung ....................... C23C 16/01
                                                                310/313 B
7,812,395 B2 * 10/2010 Sung .................... H01L 21/0237
                                                                257/347
(Continued)

FOREIGN PATENT DOCUMENTS

JP    2003-147527 A    5/2003
JP    2007-537127 A    12/2007
(Continued)

OTHER PUBLICATIONS

Cho, J et al; IEEE Transactions on Components, Packaging and Manufactring Technology; 2013; vol. 3; No. 1; pp. 79-85. Improved Thermal Interfaces of GaN-Diamond Composite Substrates for HEMT Applications.
(Continued)

*Primary Examiner* — Andy Huynh
(74) *Attorney, Agent, or Firm* — Patent Office of Dr. Chung Park

(57) ABSTRACT

Methods of fabricating compound semiconductor device structures having polycrystalline CVD diamond. The method includes: providing a substrate that has a layer of single crystal compound semiconductor material; forming a bonding layer on a surface of the substrate, the bonding layer having a thickness of less than 25 nm and a thickness variation of no more than 15 nm; and growing a layer of polycrystalline diamond on the bonding layer using a chemical vapor deposition technique. The effective thermal boundary resistance at the interface between the layer of single crystal compound semiconductor material and the layer of
(Continued)

polycrystalline CVD diamond material is less than 25 m²K/GW. The layer of single crystal compound semiconductor material has one or both of the following characteristics: a charge mobility of at least 1200 $cm^2V^{-1}s^{-1}$; and a sheet resistance of no more than 700 Ω/square.

16 Claims, 4 Drawing Sheets

Related U.S. Application Data

(60) Provisional application No. 62/093,727, filed on Dec. 18, 2014.

(51) Int. Cl.
  *H01L 29/20* (2006.01)
  *H01L 29/778* (2006.01)

(52) U.S. Cl.
  CPC .... *H01L 21/0262* (2013.01); *H01L 21/02115* (2013.01); *H01L 21/02304* (2013.01); *H01L 21/02376* (2013.01); *H01L 21/02444* (2013.01); *H01L 21/02527* (2013.01); *H01L 21/02639* (2013.01); *H01L 29/2003* (2013.01); *H01L 29/7787* (2013.01); *H01L 21/02271* (2013.01)

(58) Field of Classification Search
  USPC .......................................................... 257/76
  See application file for complete search history.

(56) References Cited

U.S. PATENT DOCUMENTS

| | | | |
|---|---|---|---|
| 2008/0096309 A1* | 4/2008 | Sung | H01L 21/0237 438/105 |
| 2008/0296586 A1 | 12/2008 | Francis et al. | |
| 2014/0110722 A1 | 4/2014 | Kub et al. | |
| 2014/0339684 A1 | 11/2014 | Mollart | |

FOREIGN PATENT DOCUMENTS

| | | |
|---|---|---|
| JP | 2013-18692 A | 1/2013 |
| WO | 2013/160383 A1 | 10/2013 |

OTHER PUBLICATIONS

2014 IEEE Compound Semiconductor Integrated Circuit Symposium (CSICS); pp. 1-4. Thermal Interface Resistance Measurements for GaN-on-Diamond Composite Substrates.

* cited by examiner

METHOD OF FABRICATING COMPOUND SEMICONDUCTOR DEVICE STRUCTURES HAVING POLYCRSTALLINE CVD DIAMOND

CROSS-REFERENCE TO PRIOR ART APPLICATIONS

This application is a divisional application of a U.S. patent application Ser. No. 15/531,463, filed on May 29, 2017, which is a national Stage Patent Application of PCT International Patent Application No. PCT/EP2015/079061, filed on Dec. 9, 2015 under 35 U.S.C. § 371, which claims priority of U.S. 62/093,727, filed on Dec. 18, 2014 and GB 1502698.2, filed on Feb. 18, 2015, which are all hereby incorporated by reference in their entirety.

FIELD OF THE INVENTION

Certain embodiments of the present invention relate to compound semiconductor device structures, and methods of fabrication, comprising polycrystalline CVD diamond with low thermal boundary resistance between the compound semiconductor and the polycrystalline CVD diamond. The primary application of this invention is thermal management of high-power electronic and optoelectronic devices.

BACKGROUND OF THE INVENTION

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic devices while maximizing performance (power and speed) and reliability. Examples of such devices are microwave transistors, light-emitting diodes and semiconductor lasers. Depending on the frequency of operation and power requirements, these devices have been conventionally made on silicon, gallium arsenide (GaAs), indium phosphide (InP), and in recent years gallium nitride (GaN), aluminum nitride (AlN) and other wide-gap semiconductors. Gallium nitride material systems in particular give rise to microwave transistors with high-electron mobility (necessary for high-speed operation), high breakdown voltage (necessary for high power), and thermal conductivity that is greater than GaAs, InP, or silicon, and thus advantageous for use in high power applications. GaN is also used in manufacturing of blue and ultraviolet lasers and light-emitting diodes. In spite of the high-temperature performance, GaN electronic and optoelectronic devices are limited in performance due to relatively low thermal resistance of the substrates commonly used for growth of GaN. This deficiency is most pronounced in high-power microwave and millimeter-wave transistors and amplifiers where reduced cooling requirements and longer device life, both benefiting from lower junction temperature, are in critical demand. Similar need is exhibited in high-power blue and ultraviolet lasers where a several-micrometer-wide laser cavity stripe dissipates power into the chip though low thermal conductivity materials.

It is well known that when considering isotropic behaviors diamond is the most thermally conductive substance known to man at room temperature. For this reason, the semiconductor industry has been employing diamond heat-sinks and heat spreaders for improved thermal management since the commercialization of synthetic diamond by chemical-vapor deposition in the 1980s. The objective of optimal heat management is to bring the diamond heat-spreader or diamond layers into close proximity to the heat source in the electronic or optoelectronic devices. This means building devices on thin chips and mounted on diamond heat-spreaders, coating devices with diamond layers, or transferring device epilayers (epitaxially grown semiconductor layers) onto diamond.

GaN-on-diamond technology and resulting devices (described in U.S. Pat. No. 7,595,507) involve structures which feature GaN epilayers less than a micron from a CVD diamond substrate. This technology enables bringing together the best heat conductor (diamond) together with electronic and optoelectronic devices based on gallium-nitride (GaN) and GaN-related compounds while minimizing any thermal barrier associated with, for example, more common semiconductor-solder-diamond attachment schemes. Due to GaN's inherent high critical electrical field and wide bandgap, GaN devices are preferred for high power electrical and optoelectronic applications, such as, high power RF transistors and amplifiers, power management devices (Schottky diodes and switching transistors), as well as, high power blue and ultraviolet lasers or light-emitting diodes.

GaN is presently grown on several different substrates: sapphire, silicon, silicon carbide, aluminum nitride, single-crystal diamond, and GaN substrates. With the exception of GaN substrates, all other materials have lattice constants that differ from that of GaN and AlGaN. Natural diamond is an excellent thermal conductor, but has not been available for these applications due to its available area, reduced thermal properties over high purity synthetic diamond, and cost. Presently, synthetic diamond is being manufactured with various degrees of crystallinity. Polycrystalline diamond deposited by chemical-vapor deposition (CVD) is suitable for use in the semiconductor industry as its thermal conductivity is close to that of single crystal diamond, it can provide electrical isolation, has low dielectric losses, and can be made transparent. CVD diamond substrates for semiconductor industry can be formed as round wafers with standard diameters. Diamond wafers are manufactured by chemical vapor deposition by one of three main methods: plasma enhanced diamond CVD where the energy to dissociate the reactants comes from a microwave source, thermally assisted diamond CVD where the energy for dissociating gasses comes from a hot filament, and plasma torch where ions are accelerated using a high DC voltage. In these processes, synthetic diamond is grown on top of non-diamond substrates, such as, silicon, silicon nitride, silicon carbide and different metals.

The CVD diamond growth process is carried out in a vacuum chamber within which a substrate is provided on top of which diamond is to be grown. The substrate is exposed to the energy source needed to dissociate molecules of precursor gases needed to form diamond on the surface of the substrate. The precursor gases needed in the chemical vapor deposition of diamond are a source of carbon diluted in hydrogen ($H_2$). Typical carbon-carrying gases are methane ($CH_4$), ethane ($C_2H_6$), carbon monoxide (CO), and acetylene ($C_2H_2$), with methane ($CH_4$) being the most commonly used. The gas combination needed for efficient diamond deposition contains a small (several percent) composition of the carbon-carrying gas in hydrogen, and the reaction can be further assisted with addition of oxygen or oxygen precursors such as CO or $CO_2$. A most common parameter specifying the gas-flow recipe is given in terms of the molar ratio of carbon carrying gas flow and hydrogen gas flow. For example, in terms of percentage [$CH_4$]/[$H_2$] where

[CH$_4$] and [H$_2$] are molar flow rates typically measured in standard cubic centimeters per minute (sccm). Typical substrate temperatures during the deposition process are between 550° C. and 1200° C., and deposition rates are usually measured in micrometers (μm) per hour.

Growth of synthetic diamond on non-diamond substrates includes a surface preparation phase and a nucleation phase in which conditions are adjusted to enhance the growth of diamond crystals on the host (non-diamond) substrate. This is most commonly done by seeding (linked also to substrate scratching) the surface with diamond powder in a controlled and repeatable manner. During the growth phase, the grain size of synthetic diamond increases and as a result synthetic diamond films are inherently rough after deposition. The nucleation of diamond generally starts with very small diamond domains embedded in non-diamond matrix which has poor thermal conductivity in the near-substrate regions. Various types of seeding have been discussed in the prior art including mechanical, ultrasonic and mega-sonic seeding of nucleation layers on various substrates and wafers.

The increasing high power density in GaN-based HEMTs (high electron mobility transistors) makes thermal management critically important. CVD polycrystalline diamond of high thermal conductivity offers superior heat removal capability near the device junction compared to state-of-the-art SiC substrates. The latest GaN-on-diamond HEMTs have demonstrated excellent device characteristics [D. C. Dumka et al., IEEE Electron Lett. 49(20), 1298 (2013)] and are scalable to 4-inch wafers [D. Francis et al., Diamond Rel. Mater. 19(2-3), 229 (2010)]. This GaN-on-diamond technology starts with a MOCVD-grown AlGaN/GaN epilayer on silicon or silicon carbide, and involves depositions of a thin dielectric seeding layer which may be amorphous or polycrystalline (e.g. silicon carbide, silicon, silicon nitride, aluminium nitride, magnesium oxide, boron nitride, or beryllium oxide) and CVD diamond on the exposed GaN, following the removal of the native GaN growth substrate and transition layers [D. C. Dumka et al., IEEE Electron Lett. 49(20), 1298 (2013); D. Francis et al., Diamond Rel. Mater. 19(2-3), 229 (2010)]. The dielectric seeding layer serves as both a nucleation layer for the diamond material and a protective layer for the GaN during diamond growth. As such, the dielectric seeding layer must be sufficiently thick to fulfill these functions. However, the dielectric interlayer and the initial nucleation layer of diamond growth result in an effective thermal boundary resistance (TBR$_{eff}$) at the GaN/diamond interface, which is a major thermal barrier that limits the full thermal benefit of diamond [J. W. Pomeroy et al., Appl. Phys. Lett. 104(8), 083513 (2014)].

To date, direct growth of diamond on GaN has been problematic. This has primarily been due to reaction of atomic hydrogen with exposed GaN and the subsequent degradation and reduction of the GaN substrate. The typical method for circumventing the problem known to practitioners in the art has been to grow a dielectric interlayer on top of the GaN which serves as both a protective layer for GaN and a nucleation layer for diamond as described above. While this approach has been successful in protecting the GaN layer, it has introduced multiple thermal boundaries that negatively impact the total thermal resistance and full benefits of a highly conductive substrate. In addition, the requirement for a dielectric interlayer between the GaN and the diamond introduces additional surface preparation and deposition steps into the fabrication process which increase the complexity and expense of the fabrication process.

A significant challenge in achieving intimate integration of diamond with GaN, lies in balancing the reduction of thermal boundary resistance (TBR) due to various layers at the interface of GaN and diamond, achieving the right level of seeding for robust adhesion to the nucleating layer(s), and providing sufficient protection for the underlying GaN when depositing CVD diamond thereon so as to not adversely affect the electronic properties of the GaN epilayer structure. The present inventors have studied the effect of the dielectric interlayer thickness on the effective thermal boundary resistance (TBR$_{eff}$) at the GaN/diamond interface. The present inventors have previously found that a dielectric interlayer of at least 35 nm thickness is required to protect a GaN substrate during CVD diamond growth thereon. However, this results in a lower limit to the effective thermal boundary resistance between the GaN and diamond of about 25 m$^2$ K/GW.

SUMMARY OF THE INVENTION

The present inventors have developed two different diamond seeding techniques along with controlled early stage CVD diamond growth which allows a reduction in thickness or a complete elimination of the dielectric interlayer between the compound semiconductor and the diamond while still allowing diamond growth on the compound semiconductor without damaging the compound semiconductor material. One technique uses nano-crystalline diamond seeding to form a nano-crystalline diamond nucleation layer which can effectively replace the non-diamond dielectric interlayer described in the background section of this specification. The other technique retains a non-diamond dielectric interlayer but with a reduced thickness of less than 25 nm and avoids damage of the underlying compound semiconductor during CVD diamond growth by ensuring that the dielectric interlayer has a high degree of flatness and thickness uniformity, is seeded using a "soft-seeding" method which does not introduce damage into the dielectric interlayer prior to CVD diamond growth thereon, and using controlled early stage CVD diamond growth to ensure that the dielectric interlayer is not etched through to the underlying compound semiconductor material. A combination of the two different seeding techniques can also be utilized, i.e. a reduced thickness non-diamond dielectric interlayer with a nano-crystalline diamond nucleation layer thereon.

In the case of a nano-crystalline diamond seeding it has been found that a suitable seed layer can be formed using a colloidal suspension of nanocrystalline diamond powder and application of sonic power, with particle size, deposition time, and sonic power selected to achieve the required effective thermal boundary resistance (TBR$_{eff}$) while also ensuring that the seed layer functions as an effective protective barrier during CVD diamond growth such that the underlying compound semiconductor is not unduly damaged. Further still, it has been surprisingly found that such a seed layer does not prevent adhesion of the CVD diamond layer to the compound semiconductor substrate. This is very surprising as one would have thought that the provision of a relatively thick layer of nano-crystalline seed particles over the substrate would prevent adhesion of the CVD diamond layer to the compound semiconductor substrate. That is, one would have thought that the CVD diamond layer would bond to the layer of nano-crystalline seed particles but the nano-crystalline seed particles would not become bonded to the underlying compound semiconductor substrate. While not being bound by theory, it would appear that vapour phase infiltration of the nano-crystalline diamond seed layer may occur during the early stages of diamond growth resulting in the nano-crystalline seed particles bonding to the underlying compound semiconductor substrate and also to each other to form a coherent bonded nanocrystalline diamond layer without unduly damaging the underlying compound semiconductor substrate.

In the case of a non-diamond dielectric interlayer, it has surprisingly been found that this can be reduced to thicknesses of less than 25 nm while still not damaging underlying compound semiconductor material during CVD diamond growth thereon. In this case, it has been found that in the early stages of polycrystalline CVD diamond growth on a dielectric interlayer, the dielectric interlayer is etched away by the hydrogen plasma of the diamond CVD synthesis atmosphere in regions which are not coated with diamond (i.e. prior to a complete coating of diamond forming over the dielectric interlayer). If regions of the dielectric layer are etched through to the underlying compound semiconductor layer then this damages the compound semiconductor layer and detrimentally affects the electronic characteristics of the layer which are essential for high power semiconductor device applications. It is for this reason that in previous work a dielectric interlayer of at least 35 nm thickness was provided to protect a GaN substrate during CVD diamond growth thereon. However, by investigating the microstructure of the dielectric interlayer and how this is affected by use of different seeding techniques and CVD diamond growth conditions, it has now been found that the problem of etch-through of the dielectric interlayer is exacerbated by non-uniformities in the thickness of the dielectric interlayer with thinner regions effectively forming weak regions prone to etch-through. These thinner regions can be a result of non-uniformities in the flatness/roughness of the compound semiconductor surface on which the dielectric interlayer is deposited and/or non-uniformities in the thickness of the dielectric layer as a result of the deposition process for the dielectric interlayer. It has also been found that thinner regions can be a result of deep scratches formed in the dielectric interlayer during seeding with a diamond powder, e.g. using the common method of rubbing the surface to be seeded with diamond powder. Further still, the problem of etch through is also exacerbated by using early growth stage diamond synthesis conditions which unduly etch exposed regions of the dielectric layer prior to a complete coating of diamond material forming over the dielectric layer. If these problems are alleviated then the dielectric layer can be significantly reduced in thickness without etch-through and damage of the underlying compound semiconductor material during CVD diamond growth thereon. This can be achieved by: careful planarization of the compound semiconductor surface prior to deposition of a dielectric interlayer thereon; careful control of the dielectric interlayer process to provide a high flatness, low roughness dielectric interlayer surface and a uniform dielectric interlayer thickness; optional further surface processing of the dielectric interlayer to form the high flatness, low roughness dielectric interlayer surface and a uniform dielectric interlayer thickness; use of a soft-seeding method to seed the dielectric layer with diamond powder without forming deep scratches in the dielectric layer which includes the option to not use bias enhanced nucleation rather than a mechanical diamond powder seeding technique; and controlled CVD diamond deposition conditions in the initial stages of CVD diamond growth to prevent etch through of the bonding layer into the compound semiconductor layer by, for example, introducing sufficient carbon containing gas into the CVD synthesis atmosphere during the initial stages of diamond growth such that the bonding layer is entirely coated in polycrystalline CVD diamond prior to any regions of the bonding layer being etched through to the compound semiconductor layer.

The above-described approach has several advantages: (i) the bonding layer at the diamond-semiconductor interface can be made thinner thus reducing thermal boundary resistance and improving the thermal characteristics of the semiconductor device; (ii) the uniformity of the thermal boundary resistance across the semiconductor device structure is improved thus alleviating non-uniformities in the performance of the device structure in high power semiconductor applications; and (iii) the semiconductor material is not damaged during CVD diamond growth thereon such that it retains good electronic properties suitable for high power semiconductor applications.

In light of the above, there is provided a semiconductor device structure comprising:

A. a layer of compound semiconductor material; and
B. a layer of polycrystalline CVD diamond material,
C. wherein the layer of polycrystalline CVD diamond material is bonded to the layer of compound semiconductor material via a bonding layer having a thickness of less than 25 nm and a thickness variation of no more than 15 nm,
D. wherein an effective thermal boundary resistance ($TBR_{eff}$) as measured by transient thermoreflectance at an interface between the layer of compound semiconductor material and the layer of polycrystalline CVD diamond material is less than 25 m$^2$ K/GW with a variation of no more than 12 m$^2$ K/GW as measured across the semiconductor device structure, and
E. wherein the layer of compound semiconductor material has one or both of the following characteristics:
F. a charge mobility of at least 1200 cm$^2$ V$^{-1}$ s$^{-1}$; and
G. a sheet resistance of no more than 700 Ω/square.

Embodiments of the present invention provide a diamond-to-compound semiconductor (e.g. GaN) interface which has an ultra-low and uniform thermal barrier resistance in combination with an undamaged compound semiconductor layer. As such, both thermal and electronic properties of the device structure can be optimized. Furthermore, by building up an understanding and capability as to what gives a high yield, uniform, low thermal barrier resistance consistent with electronic performance requirements in end applications, the present inventors have been able to achieve controlled and targeted ultra-low and uniform thermal barrier resistance values while retaining electronic performance characteristics of the compound semiconductor material. That is, one can start with a high quality single crystal compound semiconductor substrate and grow a polycrystalline CVD diamond layer over the substrate so that the diamond is in intimate thermal contact with the single crystal compound semiconductor without unduly damaging the compound semiconductor.

The present invention also provides a method of fabricating a semiconductor device structure as defined above, the method comprising:

A. providing a substrate comprising a layer of compound semiconductor material;
B. forming a bonding layer on a surface of said substrate, said bonding layer having a thickness of less than 25 nm and a thickness variation of no more than 15 nm; and
C. growing a layer of polycrystalline CVD diamond on said bonding layer using a chemical vapour deposition (CVD) technique. Surface preparation, seeding, and early stage CVD diamond growth are controlled to prevent etch through of the bonding layer into the compound semiconductor layer including, for example, introducing sufficient carbon containing gas into the CVD synthesis atmosphere during the initial stages of diamond growth such that the bonding layer is entirely coated in polycrystalline CVD diamond prior to any regions of the bonding layer being etched through to the compound semiconductor layer. The step of forming the bonding layer may comprise planarizing the compound semiconductor layer, depositing the bonding layer, optionally further planarizing the bonding layer, and then seeding the bonding layer with diamond powder, wherein the seeding is controlled such that no deep scratches are introduced into the bonding layer thereby meeting strict thickness variation requirements.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF THE INVENTION

Before describing the methodology for achieving low thermal boundary resistance GaN-on-Diamond products in accordance with embodiments of the present invention, a description of a new measurement technique for probing the thermal boundary resistance of such products is given below.

The measurement technique comprises a transient thermoreflectance method to characterize the GaN-on-diamond $TBR_{eff}$. This fully contactless technique does not require any additional deposition and can be used on as-grown wafers prior to device fabrication. The rapid evaluation of wafer thermal resistance enables GaN-on-diamond wafer manufacturers to refine the growth conditions for improving the transistor thermal performance.

Figure 1:
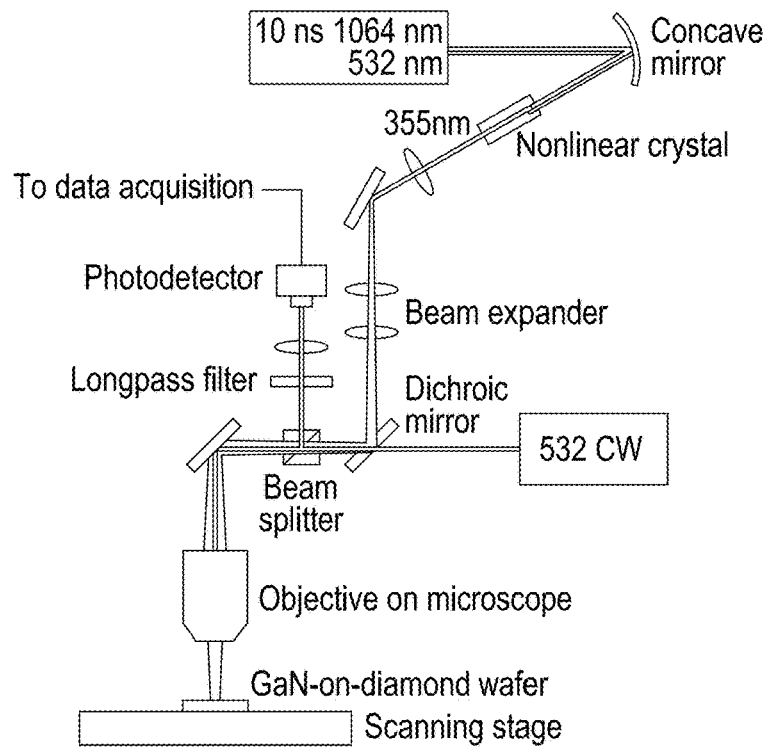
FIG. 1 shows a schematic of a transient thermoreflectance measurement setup used to measure an effective thermal boundary resistance ($TBR_{eff}$) at an interface between a layer of compound semiconductor material and a layer of polycrystalline CVD diamond material.

The nanosecond transient thermoreflectance method is a laser-based pump-probe technique [J. W. Pomeroy et al., IEEE Electron Device Lett. 35(10), 1007 (2014)]. A 10 ns, 355 nm pulse laser (third harmonic of Nd:YAG) above the GaN bandgap is used as a pump beam to impulsively heat the AlGaN/GaN surface. This temperature rise induces a change in the surface reflectance which is linearly temperature dependent. A 532 nm CW laser (second harmonic of Nd:YAG) is used as a probe beam to monitor this reflectance (and thus temperature) change in the time domain. The surface temperature relaxes due to heat diffusion into the GaN layer and diamond substrate, and in this way thermal properties including $TBR_{eff}$ can be extracted from the temperature transient. The two laser beams are coaxially directed to a standard microscope for convenient wafer mapping. An amplified silicon photodetector is used to record the intensity of the probe laser reflected from the sample surface. A schematic of the experimental setup is shown in FIG. 1.

Figure 2:
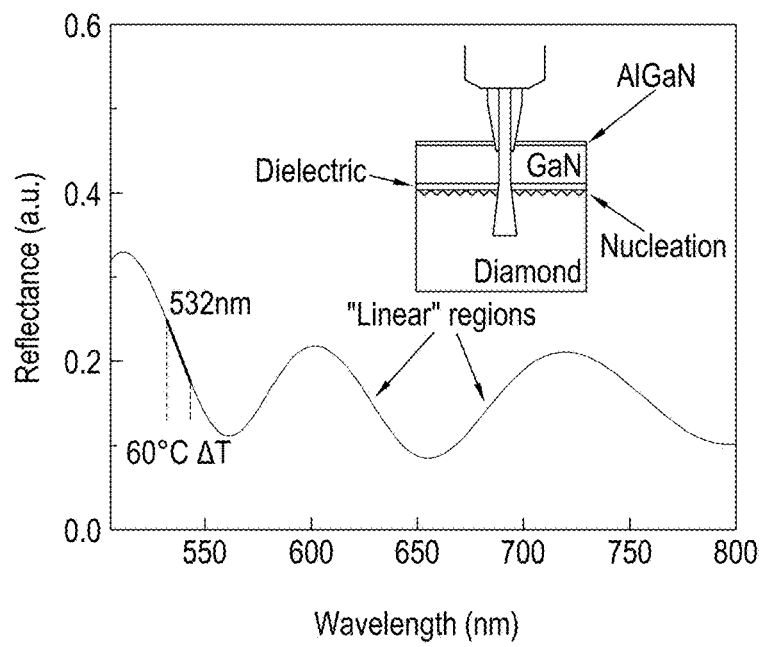
FIG. 2 shows a reflectance spectrum of a GaN-on-diamond wafer, demonstrating the validity of the linear approximation between reflectance change and surface temperature modulation at a probe laser wavelength of 532 nm.

Under certain conditions, due to partially coherent internal reflections when the probe laser wavelength is in the vicinity of the maximums or minimums of the total reflectance spectrum, the reflectance change may not be proportional to the surface temperature modulation. The probe laser wavelength (532 nm) chosen here does not fall into these "nonlinear" regions, which is illustrated in FIG. 2. A temperature rise of 60° C. is equivalent to a 10 nm shift in wavelength for the reflectance, calculated using the wavelength [N. A. Sanford et al., J. Appl. Phys. 94(5), 2980 (2003)] and temperature [N. Watanabe, et al., J. Appl. Phys. 104(10), 106101 (2008)] dependence of the GaN refractive index. In these measurements, the maximum temperature modulation is less than 60° C., within regions where a linear approximation between reflectance change and surface temperature rise is valid. Moreover, identical thermoreflectance decays were obtained on wafers with and without a gold transducer [J. W. Pomeroy et al., IEEE Electron Device Lett. 35(10), 1007 (2014)], verifying that the response indeed originates from the surface temperature.

Figure 3:
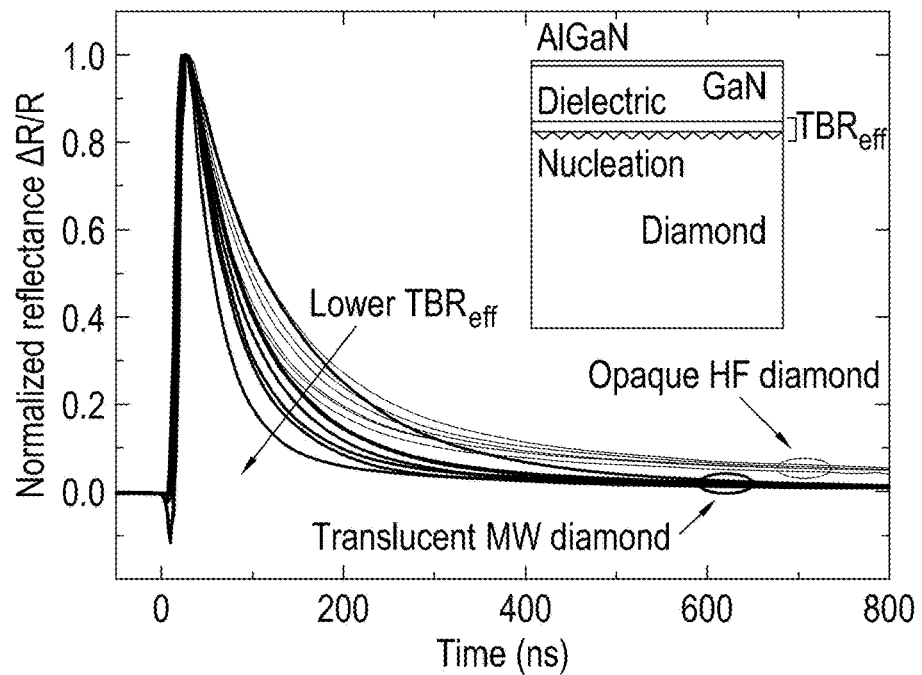
FIG. 3 shows a normalized transient reflectance of GaN-on-diamond wafers with different thicknesses of the dielectric seeding layer—Two diamond growth methods were used: hot filament (HF) CVD; and microwave (MW) plasma CVD (inset shows a schematic of the sample layer structure)

FIG. 3 shows the time-resolved normalized reflectance change of a series of GaN-on-diamond wafers, each having a nominal thickness of the dielectric seeding layer from 28 nm to 100 nm, and a diamond substrate grown by either hot filament (HF) CVD or microwave (MW) plasma CVD. A faster decay in the transient (and thus the surface temperature) indicates a lower $TBR_{eff}$ as heat diffuses more efficiently into the diamond substrate. This measurement is most sensitive to $TBR_{eff}$ since the GaN/diamond interface is the dominant heat barrier. The effect of the diamond substrate, however, also contributes to the temperature transient as seen on the long timescales in FIG. 3. The separation of the transients beyond 500 ns suggests that opaque HF diamond has a smaller thermal conductivity than the translucent MW diamond.

Figure 4:
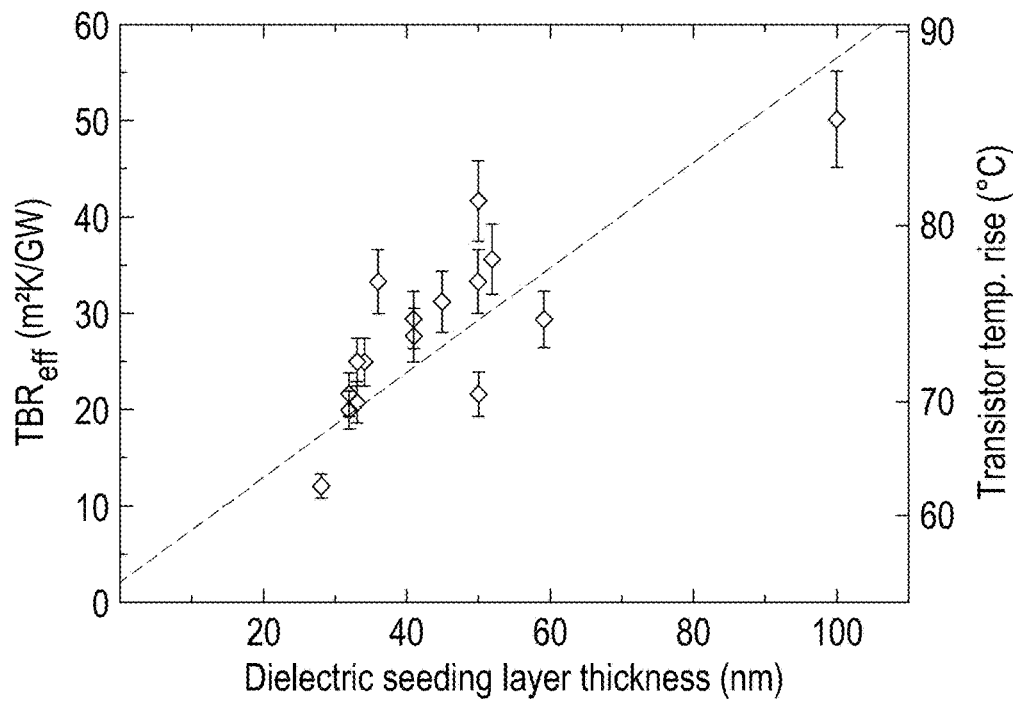
FIG. 4 shows $TBR_{eff}$ of the GaN/diamond interface as a function of the dielectric seeding layer thickness—the corresponding transistor peak channel temperature rise is indicated on the right vertical axis.

The measured transients were fitted using a finite element thermal model and the extracted $TBR_{eff}$ is plotted as a function of the dielectric interlayer thickness in FIG. 4. $TBR_{eff}$ follows approximately a linear relationship with the dielectric layer thickness; the deviations are likely due to the contribution of the diamond nucleation surface that varies from wafer to wafer. Using a multi-finger transistor thermal model [J. W. Pomeroy et al., IEEE Electron Device Lett.

35(10), 1007 (2014)], the peak channel temperature rise corresponding to each $TBR_{eff}$ was calculated and shown on the right vertical axis. This highlights the importance of reducing $TBR_{eff}$ to lower the device thermal resistance. By decreasing $TBR_{eff}$ from 50 m² K/GW to 12 m² K/GW, the transistor channel temperature rise can be reduced by 30%. However, it has been found that using standard diamond seeding techniques a ceramic interlayer of about 35 nm thickness is required to protect a GaN substrate during CVD diamond growth thereon. As can be seen from FIG. 4, this results in a lower limit to the effective thermal boundary resistance of about 20 to 25 m² K/GW.

In light of the above, the present inventors have investigated different methods of providing a better interface between a compound semiconductor substrate and a polycrystalline CVD diamond layer growth thereon. As described in the summary of invention section, it has been found that in the early stages of polycrystalline CVD diamond growth on a dielectric interlayer, the dielectric interlayer is etched away by the hydrogen plasma of the diamond CVD synthesis atmosphere in regions which are not coated with diamond (i.e. prior to a complete coating of diamond forming over the dielectric interlayer). If regions of the dielectric layer are etched through to the underlying compound semiconductor layer then this damages the compound semiconductor layer and detrimentally affects the electronic characteristics of the layer which are essential for high power semiconductor device applications. However, by investigating the microstructure of the dielectric interlayer and how this is affected by use of different seeding techniques and CVD diamond growth conditions, it has now been found that the problem of etch-through of the dielectric interlayer is exacerbated by non-uniformities in the thickness of the dielectric interlayer with thinner regions effectively forming weak regions prone to etch-through. These thinner regions can be a result of non-uniformities in the flatness/roughness of the compound semiconductor surface on which the dielectric interlayer is deposited and/or non-uniformities in the thickness of the dielectric layer as a result of the deposition process for the dielectric interlayer. It has also been found that thinner regions can be a result of deep scratches formed in the dielectric interlayer during seeding with a diamond powder, e.g. using the common method of rubbing the surface to be seeded with diamond powder. Further still, the problem of etch through is also exacerbated by using early growth stage diamond synthesis conditions which unduly etch exposed regions of the dielectric layer prior to a complete coating of diamond material forming over the dielectric layer.

It has thus been identified that if these problems are alleviated then the dielectric layer can be significantly reduced in thickness without etch-through and damage of the underlying compound semiconductor material during CVD diamond growth thereon. This can be achieved by use of a combination of techniques including:

careful planarization of the compound semiconductor surface prior to deposition of a dielectric interlayer thereon which may include, for example, a surface polishing technique and/or an etching technique to provide a flat, low roughness, low damage surface with substantially no defects protruding from the surface;

careful control of the dielectric interlayer process to provide a high flatness, low roughness dielectric interlayer surface and a low and uniform dielectric interlayer thickness;

optional further surface processing of the dielectric interlayer to form the high flatness, low roughness dielectric interlayer surface and a low and uniform dielectric interlayer thickness;

use of a seeding method to seed the dielectric layer with diamond powder without forming deep scratches in the dielectric layer which includes the option to use bias enhanced nucleation rather than a mechanical diamond powder seeding technique; and controlled CVD diamond deposition conditions in the initial stages of CVD diamond growth to prevent etch through of the bonding layer into the compound semiconductor layer by, for example, introducing sufficient carbon containing gas into the CVD synthesis atmosphere during the initial stages of diamond growth such that the bonding layer is entirely coated in polycrystalline CVD diamond prior to any regions of the bonding layer being etched through to the compound semiconductor layer.

Embodiments of the present invention may utilize a combination of the following features:

A prepared surface (low roughness/low damage/low defect density)

A controlled and measurable interlayer deposition process with nanometer precision A seeding process consistent with the interlayer and subsequent CVD diamond growth. This might include, for example:
A. Nano seeding (ultrasonic)
B. Nano seeding (electrochemical)
C. No seeding, e.g. bias-enhanced nucleation provides an alternative to a more standard pre-synthesis seeding process
D. Uniformity of the aforementioned surface preparation, interlayer deposition, and seeding across wafers having a diameter of at least 50 mm, 75 mm, 100 mm, or 140 mm A transition to diamond growth consistent with the previous steps and a targeted thermal barrier resistance. The practicalities of this transition include, for example:
A. The pressure/power ramp
B. When and how carbon species are introduced (e.g. at what substrate temperature $CH_4$ is introduced)
C. Carbon-to-hydrogen (C:H) concentration ratio
D. Uniformity of the aforementioned CVD diamond growth parameters across wafers having a diameter of at least 50 mm, 75 mm, 100 mm, or 140 mm In essence it is through this "understanding" that for the first time a GaN/interlayer/diamond product has been produced with low, controlled, and targeted TBR In one approach the compound semiconductor layer (e.g. a GaN/AlGaN epilayer) is etched to provide a flat, low roughness, low defect surface. A protective, very thin layer of an amorphous dielectric (e.g. SiN) is then deposited on the surface. Seeding can be performed using fine diamond grit applied using a lint-free cloth with a pressure measured in single digit grams/cm². This contrasts with a normal seeding approach which uses pressures measured in 100's of grams/cm². To compensate for the lower applied pressure, the soft-seeding process can be performed for an extended period relative to a more standard seeding approach, e.g. about twice as long as a standard seeding process.

One important feature of the seeding process is to form only very fine scratches on the very thin bonding layer without also causing deeper grooving and/or bulk removal of the material of the bonding layer. Standard seeding can provide fine scratches but generally also removes a significant amount of bulk material from the bonding layer. If bulk material is removed from an ultra-thin bonding layer then portions of the underlying compound semiconductor are exposed, or become exposed during early stage diamond growth. In practice, to achieve fine scratches without bulk removal one must apply only very light pressure during the seeding process. One method is similar to standard mechanical hand seeding but almost no pressure is applied to the seeding cloth. An automated mechanical seeding method may alternatively be utilized in which soft brushes are used to seed the ultra-thin bonding layer. Sufficient scratching of the surface must be achieved for effective seeding of diamond growth without imparting so many scratches and/or deep scratches that a significant amount of material is removed from the ultra-thin bonding layer.

Advantageously, CVD diamond growth on such a prepared substrate is performed using a CVD reactor technology which is adapted to provide highly controllable and uniform CVD diamond growth conditions over large area wafers. For example, WO2012/084661, WO2012/084657, WO2012/084658, WO2012/084659, WO2012/084655, WO2012/084661, and WO2012/084656 describe a microwave plasma CVD diamond reactor technology which is highly controllable and capable of providing highly uniform CVD diamond growth conditions over large area wafers including tunable control of synthesis parameters such as microwave power, electric field profile, gas flow, and substrate temperature over large area wafers. This ensures that the prepared substrate is not etched at significantly different rates in the early stages of CVD diamond growth and allows the thickness of the bonding layer to be reduced to a minimum so long as the bonding layer itself has a highly uniform thickness.

The above-described approach has several advantages: (i) the bonding layer at the diamond-semiconductor interface can be made thinner thus reducing thermal boundary resistance and improving the thermal characteristics of the semiconductor device; (ii) the uniformity of the thermal boundary resistance across the semiconductor device structure is improved thus alleviating non-uniformities in the performance of the device structure in high power semiconductor applications; and (iii) the semiconductor material is not damaged during CVD diamond growth thereon such that it retains good electronic properties suitable for high power semiconductor applications.

In light of the above, there is provided a semiconductor device structure comprising:
A. a layer of compound semiconductor material; and
B. a layer of polycrystalline CVD diamond material,
C. wherein the layer of polycrystalline CVD diamond material is bonded to the layer of compound semiconductor material via a bonding layer having a thickness of less than 25 nm and a thickness variation of no more than 15 nm,
D. wherein an effective thermal boundary resistance (TBR$_{eff}$) as measured by transient thermoreflectance at an interface between the layer of compound semiconductor material and the layer of polycrystalline CVD diamond material is less than 25 m$^2$ K/GW with a variation of no more than 12 m$^2$ K/GW as measured across the semiconductor device structure, and
E. wherein the layer of compound semiconductor material has one or both of the following characteristics:
F. a charge mobility of at least 1200 cm$^2$ V$^{-1}$ s$^{-1}$; and
G. a sheet resistance of no more than 700 Ω/square.

Embodiments of the present invention provide a diamond-to-compound semiconductor (e.g. GaN) interface with an ultra-thin bonding layer disposed therebetween and without damaging the compound semiconductor. As such, both thermal and electronic properties of the device structure can be optimized. For example, the effective thermal boundary resistance (TBR$_{eff}$) may be reduced to no more than 20 m$^2$ K/GW, 15 m$^2$ K/GW, 12 m$^2$ K/GW, 10 m$^2$ K/GW, 8 m$^2$ K/GW, or 6 m$^2$ K/GW. Furthermore, the electronic properties of the compound semiconductor may be retained to provide: a charge mobility of at least 1200 cm$^2$ V$^{-1}$ s$^{-1}$, 1400 cm$^2$ V$^{-1}$ s$^{-1}$, or 1600 cm$^2$ V$^{-1}$ s$^{-1}$; a sheet resistance of no more than 700 Ω/square, 600 Ω/square, or 500 Ω/square; a current leakage of no more than 10$^{-5}$ amps or 10$^{-6}$ amps; and/or a maximum power of at least 5 W/mm or 6 W/mm.

Figure 5:
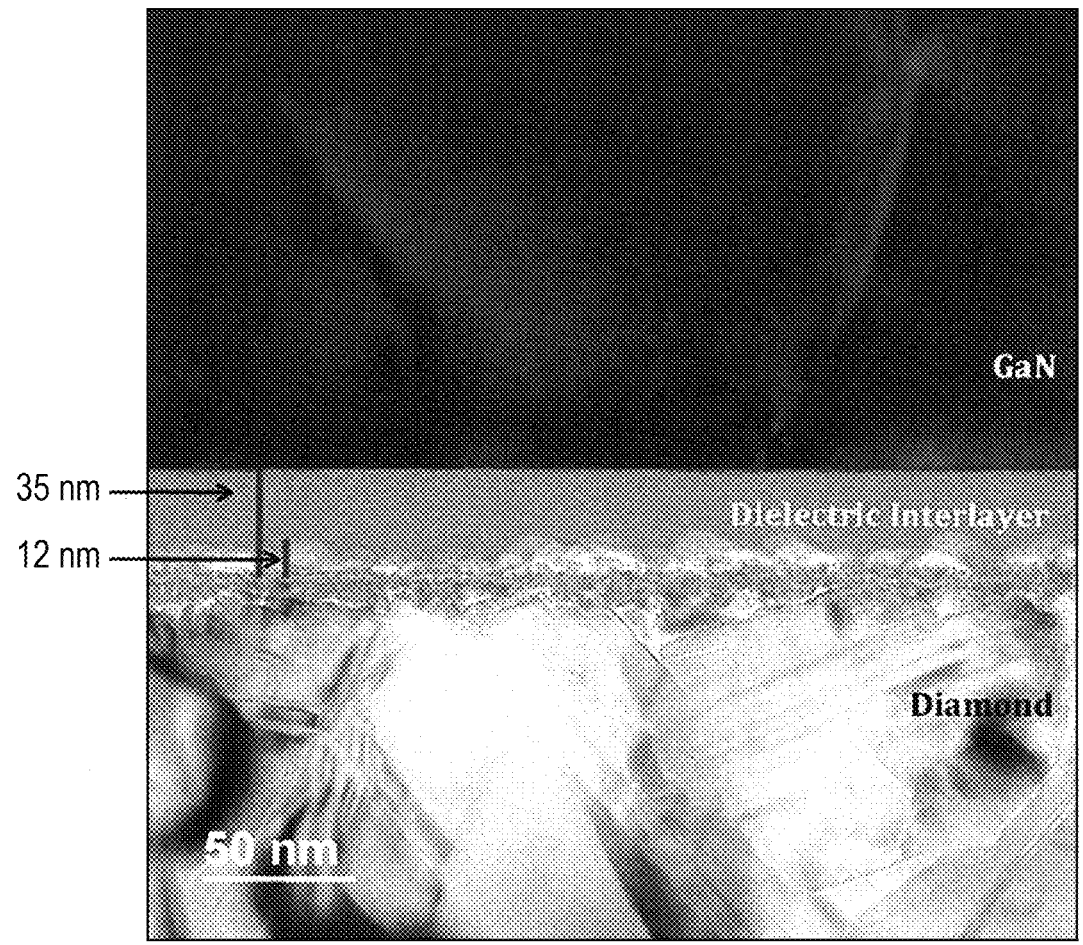
FIG. 5 shows a cross-section of a GaN/diamond interface with a 35 nm dielectric interlayer and indicates that use of soft seeding and controlled early stage diamond growth results in only approximately 12 nm of the dielectric layer being damaged by the diamond growth—this indicates that the dielectric interlayer can be significantly thinned without etch-through to the GaN during CVD diamond growth.

FIG. 5 shows a cross-section of a GaN/diamond interface with a 35 nm dielectric interlayer. By carefully planarizing the surface of the compound semiconductor, using a well-controlled dielectric interlayer deposition process, using a soft seeding methodology, and using a controlled early stage diamond growth to reduce etching of the dielectric layer, only a 12 nm thick portion of the dielectric interlayer has been affected by CVD diamond growth thereon. As such, it is clear that in this example the dielectric interlayer can be reduced in thickness to approximately 12 nm while still avoiding etch-through to the GaN material during CVD diamond growth. That is, the thickness of the bonding layer may be, for example, less than 20 nm, 15 nm, or 13 nm. Depending on the specific materials and conditions which are utilized, the thickness of the bonding layer may be at least 5 nm, 8 nm, 10 nm, or 12 nm in order to provide a bonding layer of sufficient thickness to protect the underlying GaN.

It is also evident that using the methodology as described herein the uniformity of the interface between the compound semiconductor and the diamond layers is improved. For example, the bonding layer may have a thickness variation of is no more than 12 nm, 10 nm, 8 nm, or 5 nm. This leads to more uniform thermal performance characteristics such a variation in effective thermal boundary resistance (TBR$_{eff}$) may be reduced to no more than 10 m$^2$ K/GW, 8 m$^2$ K/GW, 6 m$^2$ K/GW, or 4 m$^2$ K/GW. Furthermore, these parameters may be achieved over large area wafers having a diameter of at least 50 mm, 80 mm, 100 mm, 120 mm, or 140 mm.

The bonding layer can be formed of an amorphous or polycrystalline material. Examples of bonding layer materials include silicon carbide, silicon dioxide, silicon, silicon nitride, aluminium nitride, magnesium oxide, boron nitride, or beryllium oxide. Alternatively, the present inventors have found that a bonding layer can be formed of nano-crystalline diamond. In this alternative approach, sonication and/or electrochemical deposition of nano and/or ultra-nano-crystalline diamond is used to form a substantially void free diamond nucleation layer of a controlled thickness. This approach does not include an additional dielectric interlayer between the diamond material and the compound semiconductor material and thus avoids the requirement for an additional ceramic deposition step that subjects the compound semiconductor wafer to high temperatures and can impact yield and/or cost. Furthermore, by eliminating the additional dielectric interlayer this opens up the opportunity to further reduce the effective thermal boundary resistance between the diamond material and the compound semiconductor material down towards the theoretical minimum of 3 m$^2$ K/GW. It is also envisage that a combination of these approaches may be used to provide a thin dielectric layer in combination with a nano-crystalline diamond seed layer.

In addition, it has been found that if a carbide forming material is utilized in the bonding layer, e.g. silicon or a silicon based compound, then during the early stages of CVD diamond growth a substantial portion of the bonding layer, e.g. greater than 50%, 75%, or 90% by volume, can be converted to a carbide material such as silicon carbide. In this case, uniformity of the bonding layer and the CVD diamond synthesis process allows a controlled conversion of the bonding layer without etch through to the underlying compound semiconductor.

It has been also been found that a seed layer can be formed using a colloidal suspension of nano-crystalline diamond powder and application of sonic power, with particle size, deposition time, and sonic power selected to achieve the required effective thermal boundary resistance ($TBR_{eff}$) while also ensuring that the seed layer functions as an effective protective barrier during CVD diamond growth such that the underlying compound semiconductor is not unduly damaged. An alternative is to use electrochemical methods where the diamond/wafer relative potentials are controlled to give uniform and conformal deposition. Further still, it has been surprisingly found that such a seed layer does not prevent adhesion of the CVD diamond layer to the compound semiconductor substrate.

Whilst techniques for seeding comprising colloidal suspensions, nanocrystalline diamond powders, and application of sonic power or electrochemical deposition have been described before for seeding and growth of high nucleation density diamond, the impact and nature of such methods for improving the thermal barrier resistance of a diamond-compound semiconductor interface has not previously been demonstrated. The present inventors have devised a methodology for coating of compound semiconductor substrates that allows tailoring of the thickness and density of the seed stack dispersed on the semiconductor substrate and consequently control of the TBR associated with formation of such stacks beyond previously achieved results. By adjusting, for example, the time, the sonic power, and the seeding media the present inventors have demonstrated control of the thickness of the stack and density of the dispersion in such a way to optimize the TBR associated with presence of such a layer between GaN and diamond. In particular, by replacing the dielectric interlayer with a thick and thermally conductive ultra-nano and/or nano-crystalline diamond coating for nucleation, the present inventors have eliminated two thermal interfaces and one thermally challenged nucleation/protection layer.

Figure 6:
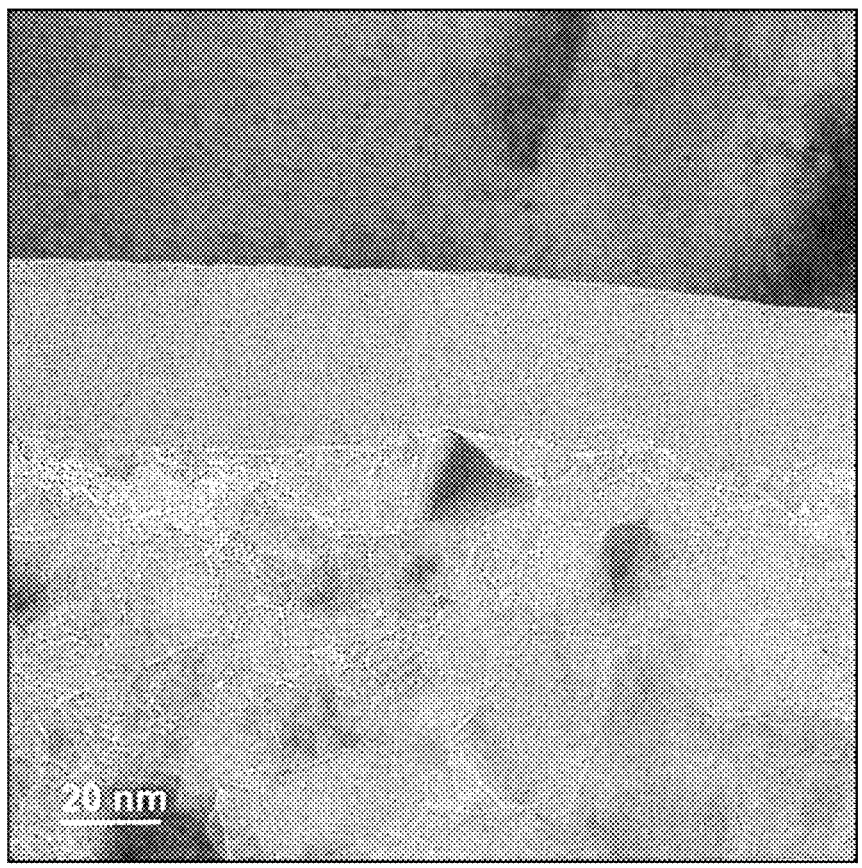
FIG. 6 shows a Transmission Electron Micrograph (TEM) cross-section of an alternative approach in which an ordered ultra-nano-crystalline diamond interlayer is provided free of interfacial voids.

FIG. 6 shows a Transmission Electron Micrograph (TEM) cross-section of the ultra-nano-crystalline seed layer indicating a well-defined, ordered nano-crystalline diamond interface with discernible diamond seeds and free of interfacial voids. The layer of nano-crystalline diamond may have a volume fraction of voids as measured using transmission electron microscopy imaging of no more than 10%, 8%, 6%, or 4%. Alternatively, or additionally, the layer of nano-crystalline diamond may have no voids having a thickness greater than 12 nm, 10 nm, or 5 nm in a representative sample comprising an area of at least 200 nm×100 nm. Preferably, the layer of nano-crystalline diamond has no visible voids discernible in transmission electron microscopy imaging in a representative sample comprising an area of at least 200 nm×100 nm.

The seed layer as described above enables polycrystalline CVD diamond material to be directed deposited on a compound semiconductor substrate without the requirement for a dielectric interlayer. The seed layer can be formed using a nanocrystalline diamond powder having an average particle size of no more than 15 nm or 10 nm and/or no less than 1 nm. A D90 particle size of the nanocrystalline diamond powder used in the seeding step can be no more than 40 nm, 30 nm, or 20 nm. Furthermore, the seed layer can be formed using a colloidal suspension of nanocrystalline diamond powder and deposition parameters, such as deposition time and sonic power, can be controlled to achieve the required effective thermal boundary resistance ($TBR_{eff}$). One method for preparing the compound semiconductor substrate is to bond a GaN on silicon wafer to a carrier silicon wafer and then etch off the growth silicon wafer leaving the bonded wafer intact. After the removal of the growth silicon wafer the back side of the GaN material is exposed. This exposed surface is then submerged in a tank with nano-diamond seeds in an alcohol solution and the entire tank is ultrasonically seeded for a period of 10 minutes. The adjustment of the thickness of the seed layer is made by adjusting the exact time of the seeding. This exact time depends on the density and size of particles. The compound semiconductor substrate is then removed from the tank and spun dry to remove poorly attached seeds. The resultant wafer, after the alcohol dries is ready for diamond deposition.

While the present invention can be applied to a range of compound semiconductors, according to certain embodiments the layer of compound semiconductor material comprises a III-V compound semiconductor material, e.g. gallium nitride. The layer of polycrystalline CVD diamond material grown on the bonding layer may have a thickness of at least 5 micrometers, 10 micrometers, 20 micrometers, 30 micrometers, 50 micrometers, 80 micrometers, 100 micrometers, 200 micrometers, 300 micrometers, or 500 micrometers. The overlying polycrystalline CVD diamond material grown on the bonding layer preferably comprises micron scale grains (i.e. the layer of polycrystalline CVD diamond material comprises grains having a size greater than 1 micron), and is preferably microwave plasma CVD diamond material, as this type of polycrystalline CVD diamond material has a higher thermal conductivity than hot filament polycrystalline CVD diamond and/or nano-polycrystalline CVD diamond.

Figure 7:
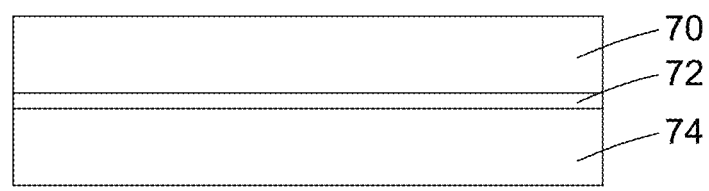
FIG. 7 shows a schematic diagram of a three layer structure comprising a layer of compound semiconductor material, an ultra-thin bonding layer, and a layer of polycrystalline CVD diamond material.

FIG. 7 shows a schematic diagram of a three layer structure comprising a layer of compound semiconductor material 70, an ultra-thin and uniform bonding layer 72, and a layer of polycrystalline CVD diamond material 74.

While this invention has been particularly shown and described with reference to embodiments, it will be understood to those skilled in the art that various changes in form and detail may be made without departing from the scope of the invention as defined by the appending claims.

The invention claimed is:

1. A method of fabricating a semiconductor device structure, comprising:
   providing a substrate comprising a layer of single crystal compound semiconductor material;
   forming a bonding layer on a surface of the substrate, the bonding layer having a thickness of less than 25 nm and a thickness variation of no more than 15 nm; and
   growing a layer of polycrystalline diamond on the bonding layer using a chemical vapor deposition (CVD) technique,
   wherein an effective thermal boundary resistance ($TBR_{eff}$) at an interface between the layer of single crystal compound semiconductor material and the layer of polycrystalline CVD diamond material is less than 25 m$^2$K/GW with a variation of no more than 12 m$^2$K/GW as measured across the semiconductor device structure,
   wherein the layer of single crystal compound semiconductor material has one or both of the following characteristics:
   a charge mobility of at least 1200 cm$^2$V$^{-1}$s$^{-1}$; and
   a sheet resistance of no more than 700 Ω/square.

2. A method according to claim 1, wherein the bonding layer is formed of a dielectric material, further comprising:
  seeding the boding layer with diamond powder.

3. A method according to claim 1, wherein the bonding layer is formed of silicon carbide, silicon, silicon nitride, silicon dioxide, aluminum nitride, magnesium oxide, boron nitride, or beryllium oxide.

4. A method according to claim 1, further comprising:
  planarizing a surface of the bonding layer.

5. A method according to claim 1, further comprising:
  planarizing a surface of the layer of single crystal compound semiconductor material.

6. A method according to claim 1, wherein the step of growing the layer of polycrystalline CVD diamond comprises introducing carbon containing gas into the CVD synthesis atmosphere during an initial stages of diamond growth such that the bonding layer is entirely coated in polycrystalline CVD diamond prior to any regions of the bonding layer being etched through to the single crystal compound semiconductor layer.

7. A method according to claim 1, wherein a thickness of the bonding layer is less than 20 nm.

8. A method according to claim 1, wherein a thickness of the bonding layer is at least 5 nm.

9. A method according to claim 1, wherein the thickness variation of the bonding layer is no more than 12 nm.

10. A method according to claim 1, wherein the bonding layer is formed of an amorphous or polycrystalline material.

11. A method according to claim 1, wherein the layer of single crystal compound semiconductor material comprises a III-V compound semiconductor material.

12. A method according to claim 11, wherein the III-V compound semiconductor material is gallium nitride.

13. A method according to claim 1, wherein the step of forming a bonding layer includes
  depositing a layer formed of at least one of nano-crystalline diamond and ultra-nano-crystalline diamond, wherein the deposited layer is substantially void free.

14. A method according to claim 1, wherein the layer of single crystal compound semiconductor material has a current leakage of no more than $10^{-5}$ amps.

15. A method according to claim 1, wherein the layer of single crystal compound semiconductor material has a maximum power of at least 5 W/mm.

16. A method according to claim 1, wherein the layer of polycrystalline CVD diamond material has a thickness of at least 5 micrometers.

\* \* \* \* \*